United States Patent

Lübbe et al.

[11] Patent Number: 5,995,817
[45] Date of Patent: Nov. 30, 1999

[54] DEVICE FOR VARYING THE CUTOFF FREQUENCY OF A LOW-PASS FILTER

[75] Inventors: Jürgen Lübbe, Jacobneuharting; Peter Kirchlechner, Hohenthann; Jörg Schambacher, München, all of Germany

[73] Assignee: STMicroelectronics GmbH, Grasbrunn, Germany

[21] Appl. No.: 08/900,932

[22] Filed: Jul. 25, 1997

[30] Foreign Application Priority Data

Jul. 26, 1996 [DE] Germany ............................ 196 30 405

[51] Int. Cl.$^6$ ...................................................... H04B 1/06
[52] U.S. Cl. ........................ 455/266; 455/307; 455/340; 455/297; 455/296
[58] Field of Search .................................. 455/266, 200, 455/295, 296, 304, 307, 314, 302, 340; 330/303, 107, 306, 305; 333/173, 174, 172; 381/99, 100

[56] References Cited

U.S. PATENT DOCUMENTS

| | | | |
|---|---|---|---|
| 3,760,287 | 9/1973 | Harris | 330/9 |
| 4,368,355 | 1/1983 | Ichikawa | 179/1 GS |
| 5,287,556 | 2/1994 | Cahill | 455/266 |
| 5,673,003 | 9/1997 | Zocher | 330/305 |
| 5,758,276 | 5/1998 | Shirakawa et al. | 455/314 |
| 5,758,296 | 5/1998 | Nakamura | 455/575 |
| 5,809,399 | 9/1998 | Tuutijarvi et al. | 455/63 |

*Primary Examiner*—Dwayne D. Bost
*Assistant Examiner*—Charles Craver
*Attorney, Agent, or Firm*—David V. Carlson; Dennis M. de Guzman; Seed and Berry LLP

[57] ABSTRACT

For eliminating the emphasis given an audio signal in the transmitter, an audio signal processor of an audio device (e.g., a car radio) contains a low-pass filter. In order to attenuate the spurious higher-frequency signal fractions in case of poor reception and accordingly low received field strength, the cutoff frequency of the low-pass filter is shifted in the direction of lower frequencies in accordance with a received field strength signal when the field strength becomes lower. In order to avoid external adjusting components and save pins on the IC chip, the field strength signal is supplied to an analog-to-digital converter and the latter supplies a digital signal to a low-pass filter whose cutoff frequency is variable. For this purpose the low-pass filter contains a number of integrated components one of which is connected or disconnected by a digit place of the digital signal in each case.

12 Claims, 2 Drawing Sheets

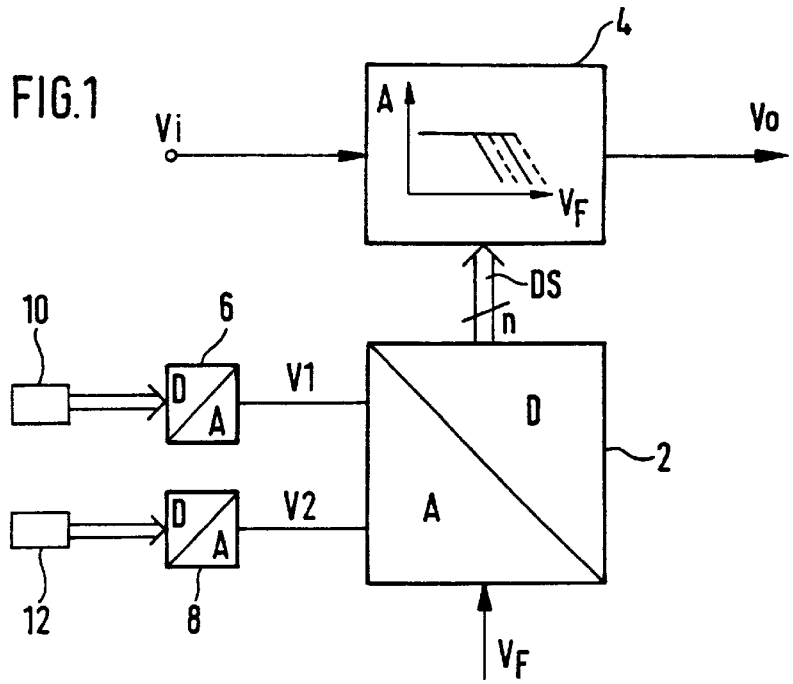
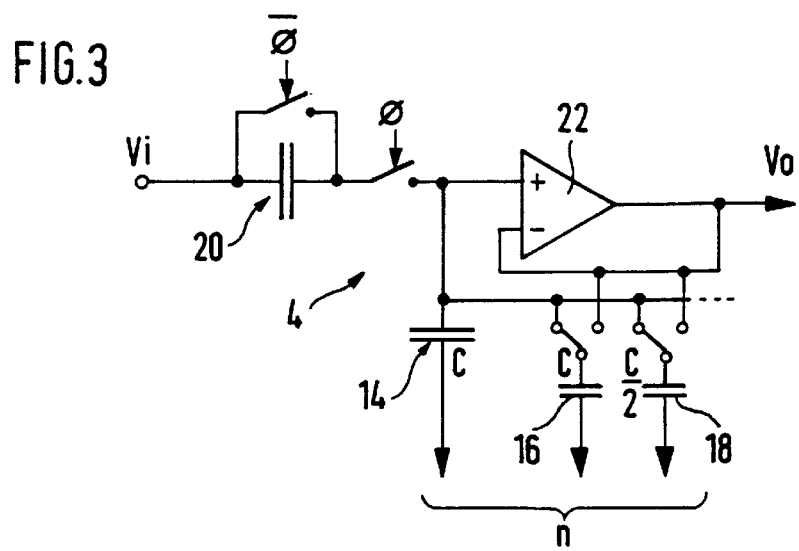

DEVICE FOR VARYING THE CUTOFF FREQUENCY OF A LOW-PASS FILTER

TECHNICAL FIELD

This invention relates to a device for varying the cut-off frequency of a low-pass filter in the signal path of an audio signal in an audio device, in accordance with the voltage level of a received field strength signal.

BACKGROUND OF THE INVENTION

In modern audio devices, in particular audio devices intended for installation in motor vehicles, one strives to form as many elements of the device as possible as integrated circuits in order to obtain a cheap and compact structure of the device with high efficiency at the same time. Audio devices for motor vehicles consist in the simplest case of only a radio; more modern components additionally have a cassette section. Devices developed more recently contain a compact disk device in addition to the radio.

The signals from the tuner section of the radio, the cassette or the compact disk device are processed further in modern audio signal processors with the aid of just one integrated circuit before being supplied to the power output stage. Such an audio signal processor contains an AM/FM stereo decoder section, filters for selectively attenuating high, middle and low frequencies, a switchover part for switching over to mono operation if the received field strength is too low for stereo operation, and further circuit parts. The individual elements of the audio processor are almost completely controlled digitally.

SUMMARY OF THE INVENTION

The present invention involves a device, also referred to as "high cut", for varying the cutoff frequency of a low-pass filter in accordance with the received field strength. If the received field strength is too low the spurious component of higher-frequency signals is relatively high, and shifting the cutoff frequency of the low-pass filter located in the signal path of the audio signal in the direction of lower frequencies attenuates more greatly the higher-frequency, very noisy signal fractions.

The amplitude response of the signal supplied by the transmitter is not constant in the total frequency range but only up to a frequency of 3 kHz. Above this frequency the amplitude response rises linearly. The low-pass filter in question in the audio signal processor eliminates this increase in higher-frequency signal fractions (emphasis). The low-pass filter has a cutoff frequency which is normally 3 kHz. The increase in higher-frequency signal fractions on the side of the transmitter is thus eliminated by the high-frequency reduction (deemphasis) taking place in the low-pass.

As an additional function of this low-pass filter, the frequency can be shifted further into the range between 1 and 3 kHz, in accordance with the received field strength.

If an audio signal processor is produced in the form of an integrated circuit, a pin of the chip is provided as the input for the received field strength signal. During production of the audio device, calibration must be performed in order to obtain the desired dependence of the cutoff frequency shift on the level of the received field strength signal. Hitherto one used chip-external components (resistors) for this purpose. Adjusting these components requires some effort. In addition the external components and their assembly constitute an additional cost factor, and reliability is also affected adversely by numerous external components. Finally, a pin is also necessary on the chip for each channel in order to connect the external components with the low-pass filter formed in the chip.

The invention is based on the problem of providing a device for varying the cutoff frequency of a low-pass filter in the signal path of an audio signal, which can fundamentally be formed completely as an integrated circuit.

This problem is solved in a device of the abovementioned kind by the following features:

a) the low-pass filter has a number of components each of which codetermines the cutoff frequency and which are each separately connectable or disconnectable by a corresponding signal; and b) the field strength signal is fed to an analog-to-digital converter whose digital output signal is supplied to the components in order to connect or disconnect them in accordance with the logic level of each digit place of the digital output signal.

The received field strength signal is obtained externally and supplied to a pin of the integrated circuit. The analog-to-digital converter converts the field strength signal into a corresponding digital value. If the digital signal has, e.g., four digit places altogether, the digital signal can represent sixteen different values, and the cutoff frequency can accordingly be adjusted to one of sixteen different values.

The connectable and disconnectable components of the low-pass filter are in particular capacitors whose capacitance values are adjusted to the weight of the digit place of the digital signal. If the digital signal has four digit places, the low-pass filter thus contains four connectable and disconnectable capacitors with capacitance values of C; C/2; C/4 and C/8 in parallel connection. Depending on which of these capacitors are activated by the relevant digit place of the digital signal, the capacitance of the parallel connection of the capacitors is adjusted to one of sixteen different possible values, so that it has a value between 0 and about 2C and yields together with an unconnected, fixed capacitor a possible total capacitance between C and about 3C.

When the integrated circuit is being designed it is of course not yet certain which level of the field strength signal corresponds to the uppermost cutoff frequency of the low-pass filter (e.g., 3 kHz), and which level of the field strength signal corresponds to the smallest possible cutoff frequency. In the prior art circuit, the corresponding calibration was done with the aid of the external components. According to the invention, however, the analog-to-digital converter has two additional inputs for adjusting signals for adjusting the characteristic of the converter.

The term "characteristic of the converter" refers to the dependence of the digital output signals of the converter on the level of the analog input signal. Normally an analog-to-digital converter supplies a digital signal with the value "zero" when the level at the input is zero, and the greatest possible value is supplied at the output of the converter when the input level corresponds to the maximum nominal level. In the analog-to-digital converter in question here the characteristic is adjusted such that at a certain, selectable level of the field strength signal the greatest possible value of the digital output signal of the converter is supplied, which then corresponds to the greatest possible cutoff frequency (3 kHz) of the low-pass filter, while at a relatively low voltage of the field strength signal the smallest possible output value of the digital signal is produced. These two stated values thus fix how strongly the control for adjusting the cutoff frequency of the low-pass filter responds to a change in the field strength signal. According to the invention, the additional inputs of the converter are supplied for this purpose two analog voltages one of which fixes the greatest and the other of which the smallest possible value of the digital signal and thus determines at which level of the field strength signal a reduction in cutoff frequency begins, or up to which level of the field strength signal this reduction is possible.

If the field strength signal is greater than the first analog voltage, there is no change in the cutoff frequency of the low-pass filter above, e.g., 3 kHz; if the field strength signal is lower than the second analog voltage, the cutoff frequency is not shifted further down but remains at the lowest value (e.g. 1 kHz).

To permit easy calibration of the low-pass filter by the manufacturer of the audio device building the audio processor formed as an integrated circuit into its device, the invention provides for the two analog voltages additionally fed to the analog-to-digital converter to be formed from presettable register contents. The digital control provided in the chip contains inputs via which, e.g., volume, treble, bass, balance and the like are adjusted. Via such inputs one can adjust the content of each of the two stated registers and thus the "characteristic" of the converter.

BRIEF DESCRIPTION OF THE DRAWINGS

In the following an embodiment will be explained more closely with reference to the drawings, in which:

FIG. 1 shows a simplified block diagram of an embodiment of an inventive device for varying the cutoff frequency of a low-pass filter;

FIG. 3 shows an embodiment of the low-pass filter formed as an integrated circuit according to FIG. 1;

FIG. 4 shows an equivalent circuit diagram for the circuit of FIG. 3; and

DETAILED DESCRIPTION OF THE INVENTION

Figure 2A:
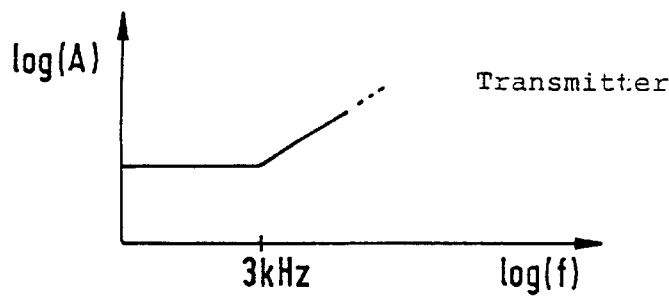
FIGS. 2a to 2c show the frequency response of a signal produced in the transmitter, the receiver-side low-pass filter according to the invention, and the signal obtained at the output of the low-pass filter.

The circuit of FIG. 1 is given analog-to-digital converter 2 which is part of an integrated circuit, like all the other components shown in the drawings. Analog-to-digital converter 2 receives at the analog signal input a received field strength signal in the form of voltage signal $V_F$ and converts this signal into digital signal DS, which is a four-digit signal with which sixteen different values can consequently be represented.

Low-pass filter 4 receives on the input side from a stereo decoder (not shown) a demodulated signal for the left or right channel. In reality, low-pass filter 4 shown in FIG. 1 is present twice in the audio processor; both receive digital output signal DS from analog-to-digital converter 2.

If reception is good the received field strength is high and signal $V_F$ accordingly has a high level. Accordingly "high" signal DS causes the cutoff frequency to be adjusted to its highest value in the low-pass filter.

Figure 5:
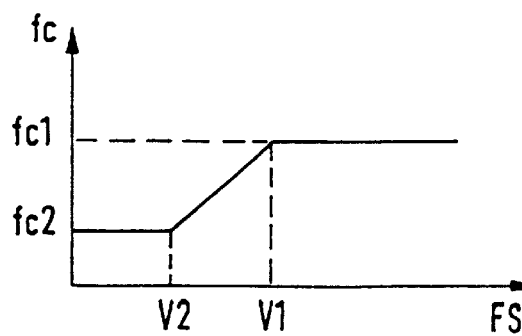
FIG. 5 shows the dependence of the cutoff frequency of the low-pass filter on the received field strength.

FIG. 5 shows the dependence of cutoff frequency fc on field strength FS. Cutoff frequency fc1 at relatively high field strengths, when signal $V_F$ is equal to or greater than V1, is 3 kHz. At field strengths supplying signal $V_F$ below V1, the cutoff frequency of the low-pass filter is lowered. This lowering of the cutoff frequency goes as far as lower limit V2. At field strengths supplying field strength signal $V_F$ below V2, lower cutoff frequency fc2 remains unchanged.

Figure 2B:
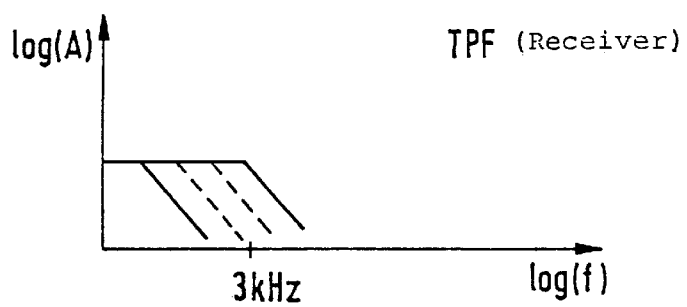
Figure 2C:
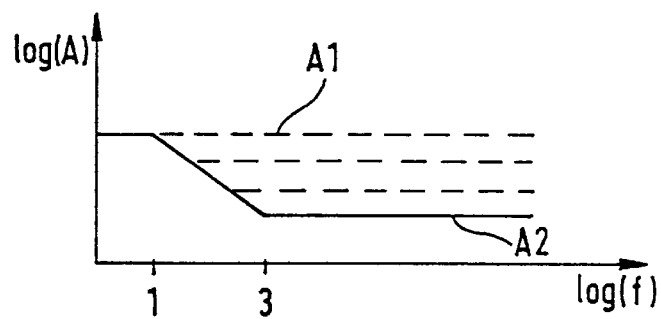

For illustration, FIGS. 2a–2c shows log—log representations of the amplitude responses of the transmitter-side signal, the low-pass filter in the receiver and the signal supplied by the low-pass filter, respectively.

As explained at the outset, the transmitter supplies a signal with an emphasis of signal components above 3 kHz (FIG. 2a). This is matched by the uppermost cutoff frequency of the low-pass filter located in the receiver. The output signal of the filter thus has the amplitude response designated A1 in FIG. 2c if reception is good.

If reception is not optimal, the level of field strength signal $V_F$ sinks. In order to suppress the spurious high-frequency noise, the cutoff frequency of the low-pass filter is shifted down so that the higher-frequency signal fractions are more greatly attenuated. This possibility of shifting the cutoff frequency is shown in FIG. 2B. The lowest cutoff frequency is shown in FIG. 2b by an unbroken characteristic; this characteristic corresponds to line A2 shown in FIG. 2c, according to which no lowering takes place below 1 kHz, attenuation is constant and greatest above 3 kHz, and attenuation increases linearly between 1 and 3 kHz.

The characteristic shown in FIG. 5, specifically value V1 corresponding to the upper cutoff frequency and value V2 corresponding to the smallest possible cutoff frequency, are ,supplied in the circuit shown in FIG. 1 to analog-to-digital converter 2 by two registers 10 and 12 via corresponding digital-to-analog converters 6, 8. Digital values can be inputted into registers 10 and 12 by the audio device manufacturer building the audio processor formed as a chip into the device, and these digital values are then converted by converters 6, 8 into two analog voltages V1 and V2, which fix the range in which analog voltage $V_F$ is converted into digital signal DS. If voltage $V_F$ has a value below V2, converter 2 for example always supplies the value "zero" (e.g., 0000) as a digital output signal. If the value of analog voltage $V_F$ is greater than V1, converter 2 always supplies the greatest possible digital value, i.e., in the case of four-digit digital signals (n=4) the value fifteen (1111).

If the value of signal $V_F$ is between V1 and V2, the analog signal is converted into a corresponding digital signal in linear dependence.

Digital signal DS is supplied to an adjusting input of low-pass filter 4.

Before the circuit of FIG. 3 is explained more closely, an "equivalent circuit diagram" of the low-pass filter according to FIG. 4 will be explained. The low-pass filter shown in FIG. 4 has resistor R, fixed, unconnected capacitor 14 and connectable capacitors 16, 18. This RC module can be adjusted such that the total capacitance is between C (with capacitors 16, 18 . . . not connected) and just below 3C (with all capacitors connected).

The circuit shown in FIG. 3 is of completely integrated design. Digital signal DS is supplied to a number of parallel-connected capacitors, of which three capacitors 14, 16 and 18 are shown, so that depending on whether the relevant digit place of digital signal DS has logic level "1" or "0" the corresponding capacitor is connected or disconnected. The gradation of the capacitance values of the capacitors corresponds to the weight of the relevant digit place of digital signal DS. Input signal Vi is supplied via switched capacitor 20 serving to simulate an ohmic resistor to the noninverting input of operational amplifier 22, which is switched as a voltage follower.

When the two capacitors 16, 18 in FIG. 3 are disconnected, they are at output Vo and consequently have the particular output voltage.

The above explanation makes clear the structure and operation of the circuit. One can see in particular that no external circuit elements are used to adjust the low-pass filter. The only quantity supplied to the chip from outside via a separate pin is received field strength signal $V_F$.

What is claimed is:

1. A device for varying a cutoff frequency of a low-pass filter in a signal path of an audio signal in an audio device, in accordance with a voltage level of a received field strength signal, the device comprising:

a) the low-pass filter having a number of components each of which codetermines the cutoff frequency and which are each separately connectable or disconnectable by a corresponding signal; and b) an analog-to-digital converter to receive the field strength signal, the analog-to-digital converter having a digital output signal supplied to the components to connect or disconnect them in accordance with a logic level of each digit place of the digital output signal, wherein the analog-to-digital converter has two additional inputs for adjusting signals for calibrating the converter, wherein the additional inputs are supplied two analog voltages one of which fixes a greatest and the other a smallest possible value of the digital output signal and determines at which level of the field strength signal a reduction in cutoff frequency begins, or up to which level of the field strength signal this reduction is possible, wherein the low-pass filter is connected to the converter if the level of the field strength signal is above the analog voltages, wherein a range of the field strength signal corresponds to a full range of the digital output signal.

2. The device of claim 1 wherein the connectable and disconnectable components comprise capacitors whose capacitance values are coordinated with a weight of the digit places of the digital signal.

3. The device according to claim 2 wherein the device is formed as part of an integrated circuit.

4. The device of claim 1 wherein the two analog voltages are formed from presettable register contents with the aid of digital-to-analog converters.

5. A low-pass filter circuit with a variable cut off frequency and control circuitry, comprising:

at least one low-pass filter with a variable cut off frequency, the cut off frequency decreasing as a field strength decreases; and switchable filter elements coupled to a digital output of an analog-to-digital converter that adjust the cut off frequency of the low-pass filter, wherein the analog-to-digital converter is coupled to available analog inputs of field strength, upper and lower field strength calibration inputs and with the digital output connected to the switchable filter elements, wherein the switchable filter elements are individually controlled by each data bit of the digital output of the analog-to-digital converter, wherein the low-pass filter is connected to the analog-to-digital converter if a level of the field strength is above a level of a signal at the upper field strength calibration input, wherein a range of the field strength corresponds to a full range of the digital output.

6. The low-pass filter circuit with a variable cut off frequency and control circuitry of claim 5, further comprising:

at least one digital storage register with externally accessible inputs and with outputs coupled to a digital to analog converter, wherein the digital-to-analog converter has an input connected to a corresponding output of a digital storage register and an output coupled to the analog-to-digital converter.

7. The low-pass filter circuit with a variable cut off frequency and control circuitry of claim 5 wherein the switchable filter elements comprise capacitors whose values are weighted to correspond to weights of place values of the digital output.

8. An audio processor, comprising:

an AM/FM stereo decoder;

a switch for switching between stereo and monophonic modes of operation;

a low-pass filter circuit with a variable cut off frequency and control circuitry, the filter circuit having:

at least one low-pass filter with a variable cut off frequency, the cut off frequency decreasing as a field strength decreases; and switchable filter elements coupled to a digital output of an analog-to-digital converter that adjust the cut off frequency of the low-pass filter, wherein the analog-to-digital converter is coupled to available analog inputs of field strength, upper and lower field strength calibration inputs and with the digital output connected to the switchable filter elements, wherein the switchable filter elements are individually controlled by each data bit of the digital output of the analog-to-digital converter, wherein the low-pass filter is connected to the analog-to-digital converter if a level of the field strength is above a level of a signal at the upper field strength calibration input wherein a range of the field strength corresponds to a full range of the digital output.

9. An integrated circuit, comprising:

a substrate; and the audio processor of claim 8.

10. A method of varying a cutoff frequency of a low-pass filter in a signal path of an audio signal, the method comprising:

feeding a field strength signal into an analog-to-digital converter;

generating a digital output signal corresponding to the field strength signal;

calibrating the analog-to-digital converter with first and second analog voltages, wherein the first and second analog voltages respectively fix a greatest and a smallest possible value of the digital output signal; and varying the cutoff frequency of the low-pass filter by separately connecting or disconnecting components of the low-pass filter based on data bits of the digital output signal, wherein the low-pass filter is connected to the converter if a level of the field strength signal is above a level of the first and second analog voltages, wherein a range of the field strength signal corresponds to a full range of the digital output signal.

11. The method of claim 10, further comprising generating the first and second analog voltages by providing digital values to a digital-to-analog converter.

12. The method of claim 10 wherein varying the cutoff frequency of the low-pass filter includes controlling a plurality of capacitors having values weighted to correspond to values of the digital output signal.

* * * * *